(12) United States Patent
Lee

(10) Patent No.: US 6,458,683 B1
(45) Date of Patent: Oct. 1, 2002

(54) METHOD FOR FORMING ALUMINUM BUMPS BY CVD AND WET ETCH

(75) Inventor: Cheng-Wei Lee, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/821,930

(22) Filed: Mar. 30, 2001

(51) Int. Cl.[7] .............................................. H01L 21/283
(52) U.S. Cl. ...................... 438/613; 438/612; 438/614; 438/615; 438/113; 438/26
(58) Field of Search ................................. 438/615, 613, 438/113, 107, 612, 614, 953, 959, 26

(56) References Cited

U.S. PATENT DOCUMENTS

| | | | | |
|---|---|---|---|---|
| 4,356,374 A | * | 10/1982 | Noyori et al. | 219/121 PE |
| 4,880,708 A | * | 11/1989 | Sharma et al. | 428/620 |
| 5,134,460 A | * | 7/1992 | Brady et al. | 357/71 |
| 5,173,449 A | * | 12/1992 | Lorenzen et al. | 437/192 |
| 6,130,149 A | * | 10/2000 | Chien et al. | 438/613 |
| 6,293,457 B1 | * | 9/2001 | Srivastava et al. | 228/254 |
| 6,312,974 B1 | * | 11/2001 | Wu et al. | 438/107 |

* cited by examiner

Primary Examiner—Matthew Smith
Assistant Examiner—V. Yevsikov
(74) Attorney, Agent, or Firm—Tung & Associates

(57) ABSTRACT

A method for forming aluminum bumps that has significantly reduced processing steps than the conventional method is disclosed. The method utilizes a chemical vapor deposition technique for the selective deposition of aluminum into an opening for forming the bump and then a wet etch process for removing a polyimide layer that functioned both as a photoresist layer for providing an opening in a passivation layer and as a support for a via hole during the selective aluminum deposition process. The thickness of the passivation layer and the polyimide layer formed on top of the metal I/O pad is important since it determines the height of the aluminum bump formed.

20 Claims, 4 Drawing Sheets

1. Pad Open

2. TiW Deposition

3. Au Deposition

4. PR Coating

5. PR Patterning

6. Gold Plating

7. PR Stripping

8. Gold Etching

9. TiW Etching

1. PR Patterning for Pad Opening

2. Pad Opening

3. Al Sputtering

4. PR Pattening for Al Etching

5. Al Etching

6. PR Strip and Bump Complete

1. Polyimide Coating

2. Polyimide Patterning

3. Pad Opening

4. Selective Al Deposition

5. Polyimide Remove and Bump Complete

US 6,458,683 B1

METHOD FOR FORMING ALUMINUM BUMPS BY CVD AND WET ETCH

FIELD OF THE INVENTION

The present invention generally relates to a method for forming aluminum bumps on a semiconductor structure and more particularly, relates to a method for forming aluminum bumps on a semiconductor structure by a chemical vapor deposition technique and a wet etch technique with significantly reduced number of processing steps.

BACKGROUND OF THE INVENTION

In the fabrication of semiconductor devices, the ever increasing device density and the decreasing device dimensions demand more stringent requirements in the packaging or interconnecting techniques for such devices. In recent years, a flip chip attachment method has been widely used in the packaging of semiconductor chips. In the flip chip attachment method, instead of attaching a semiconductor die to a lead frame in a package, an array of bumps is first formed on the surface of the die. The formation of the bumps may be carried out by a variety of methods depending on the electrically conductive material that is used to form the bumps. For instance, evaporation, electrodeposition, stencil printing, screen printing have all been used to form electrically conductive bumps on flip chips.

The more frequently utilized bump fabrication techniques are a metal deposition process and a plating process. To carry out either of the processes, a series of barrier and seed layers of metal are first deposited on the surface of the semiconductor wafer. These layers are later removed by a wet etching process everywhere except under the die pads and the layers are used to improve adhesion of subsequent layers and to form a barrier to stop metal diffusion from the bump material to the underlying die pad. In a typical bump forming process, a layer of a photoresist material is then deposited over the surface of the semiconductor wafer. A photo mask is then used to pattern the locations over each of the die pads that a bump is to be formed. An etching process, such as plasma etching is used to expose the die pads, while the openings in the photoresist layer determines the shape and height of the bump to be formed.

The electrically conductive bump, which is typically formed of gold or aluminum, can be electroplated or sputtered over the die pad and the barrier and seed layers. Once the plating or sputtering step is completed, a series of wet etching steps is used to remove the photoresist layer and the various barrier and seed layers that cover the remainder area of the wafer while the bumps protect the underlying material from being etched. While gold is the most commonly used material, other electrically conductive materials such as copper, tin-lead and aluminum as well as layered composites of these materials can also be utilized.

A conventional method for forming gold bump is illustrated in FIGS. 1A~1I. As shown in FIG. 1A, an input/output (I/O) pad 12 formed on a semiconductor substrate 14 is first provided for a semiconductor structure 10. On top of the I/O pad 12, is then deposited a passivation layer 16 of an insulating material. The passivation layer 16 is formed by a photolithographic method using a mask (not shown) to provide an opening 18 for the I/O pad 12. In the next step of the process, as shown in FIG. 1B, a diffusion barrier layer 20 of TiW is conformally deposited into the pad opening 18. On top of the TiW barrier layer 20, is then deposited a gold seed layer 22, as shown in FIG. 1C. Both the TiW barrier layer and the Au seed layer may be suitably deposited by using a sputtering technique or an electroplating technique. On top of the semiconductor structure 10, is then coated, most likely by a spin coating technique, a thick photoresist layer 24.

In the next step of the process, as shown in FIG. 1E, the photoresist layer 24 is patterned by a mask (not shown) and an opening 26 is formed by a dry etching method such as plasma etching. The opening 26 is then filled, by an electroplating process of Au, as shown in FIG. 1F. The photoresist layer 24 is then stripped by a dry etching method leaving the Au bump 28 exposed on the semiconductor 10. In the next two steps of the process, as shown in FIGS. 1H and 1I, the gold seed layer 22 is etched away by a wet etch method and then, the TiW barrier layer 20 is etched away by a wet etch method exposing only the gold bump 28 above the passivation layer 16.

The conventional gold bump forming process requires numerous photolithographic steps, numerous deposition steps and various dry etching and wet etching steps. It is a time consuming and laborious process which severely impacts the yield of the semiconductor device.

FIGS. 2A~2F demonstrates a conventional process for forming aluminum bumps which requires at least two photolithographic steps, a sputtering step and numerous etching steps. A conventional semiconductor structure 30 is first provided which has a metal pad layer, or an input/output layer 32 formed on a substrate 34. The I/O metal pad layers 32 may be advantageously formed of a conductive metal such as aluminum, or aluminum that has an alloy content, for instance, aluminum with less than 3 wt. % copper. On top of the I/O pad layer 32, is then deposited a passivation layer 36 with an insulating material such as $SiO_2$, $Si_3N_4$, SiON, SOG or polyimide. The passivation layer 36 is preferably a photo-sensitive material such that it can be imaged by placing a mask 38 on top. This is shown in FIG. 2A.

After an opening 40 is formed by a dry etch method in the passivation layer 36, as shown in FIG. 2B, an aluminum layer 42 is sputter deposited into the opening 40 and on the top surface 44 of the remaining passivation layer 36. After the aluminum sputtering process is completed, a second photoresist layer 46 is deposited and patterned on the aluminum layer 42 for forming the aluminum bump. This is shown in FIG. 2D.

In the final steps of the conventional aluminum bump filing process, as shown in FIGS. 2E and 2F, a dry etch method, such as plasma etching is used to form the aluminum bump 50 by using the photoresist layer 46 to define the bump. The photoresist layer 46 is then subsequently removed in a wet etch process to complete the formation of the aluminum bump 50. The conventional aluminum bump forming process, as shown in FIGS. 2A~2F, therefore requires numerous photolithographic and other chemical processing steps which are time consuming and laborious leading to a low yield of the process.

It is therefore an object of the present invention to provide a method for forming aluminum bumps that does not have the drawbacks or shortcomings of the conventional methods.

It is another object of the present invention to provide a method for forming aluminum bumps that does not require multiple steps of photolithography.

It is a further object of the present invention to provide a method for forming aluminum bumps that only requires a single photolithographic process.

It is another further object of the present invention to provide a method for forming aluminum bumps by a chemical vapor deposition process to selectively deposit aluminum.

It is still another object of the present invention to provide a method for forming aluminum bumps by a chemical vapor deposition process and a wet etch process.

It is yet another object of the present invention to provide a method for forming aluminum bumps by using a passivation layer and a photoresist layer with an opening therein as a mold for depositing aluminum and forming the bump.

It is still another further object of the present invention to provide a method for forming aluminum bumps that require a reduced number of processing steps than the conventional formation methods.

SUMMARY OF THE INVENTION

In accordance with the present invention, a method for forming aluminum bumps by chemical vapor deposition and wet etch is provided.

In a preferred embodiment, a method for forming aluminum bumps by chemical vapor deposition and wet etch can be carried out by the operating steps of first providing a pre-processed electronic substrate that has a plurality of input/output pads formed on top; depositing a passivation layer of an insulating material on top of the substrate; depositing a polyimide layer that has a thickness of at least 5 $\mu$m on top of the passivation layer; imaging the polyimide layer and forming a plurality of openings in the passivation and the polyimide layer; depositing a metal that includes Al by a CVD technique into the plurality of openings; and removing the polyimide layer and forming a plurality of bumps that includes Al.

The method for forming aluminum bumps by chemical vapor deposition and wet etch may further include the step of forming the plurality of I/O pads in a metal that includes aluminum, or the step of depositing the passivation layer from a material selected from the group consisting of silicon oxide, silicon nitride and spin-on-glass, or the step of depositing the passivation layer in at least two sub-layers of $Si_3N_4$ and $SiO_2$, or the step of depositing the passivation layer in two sub-layers of a first layer of $Si_3N_4$ in a thickness between about 5000 Å and about 8000 Å and a second layer of $SiO_2$ in a thickness between about 2000 Å and about 4000 Å. The method may further include the step of depositing the passivation layer to a thickness of at least 1 $\mu$m, or the step of depositing the polyimide layer to a thickness of at least 5 $\mu$m, or a thickness between about 5 $\mu$m and about 10 $\mu$m. The method may further include the step of forming the plurality of openings by plasma etch, or the step of depositing a metal including Al and Cu by CVD into the plurality of openings. The method may further include the step of removing the polyimide layer by wet etch, or by an etchant that includes HF and $NH_4F$.

The present invention is further directed to a method for forming aluminum bumps by chemical vapor deposition and wet etch that can be carried out by the steps of providing a pre-processed semiconductor structure that has a plurality of I/O pads formed on top; depositing a passivation layer of an insulating material on top of the structure; printing a polyimide layer on top of the passivation layer exposing the portions of passivation layer that overlies the plurality of I/O pads; plasma etching through the passivation layer by using the polyimide layer as a mask forming a plurality of openings to expose the plurality of I/O pads; filling the plurality of openings with a metal that includes Al by a CVD technique; and removing the polyimide layer and exposing a plurality of Al bumps.

The method for forming aluminum bumps by chemical vapor deposition and wet etch may further include the step of forming the plurality of I/O pads with a metal that includes Al, or the step of depositing the passivation layer in a material that is selected from the group consisting of silicon oxide, silicon nitride and spin-on-glass. The method may further include the step of depositing the passivation layer in at least two sub-layers of $Si_3N_4$ and $SiO_2$, or at least two sub-layers of a first layer of $Si_3N_4$ in a thickness between about 5000 Å and about 8000 Å and a second layer of $SiO_2$ in a thickness between about 2000 Å and about 4000 Å. The method may further include the step of printing the polyimide layer by screen printing or stencil printing, or the step of filling the plurality of openings with a metal that includes Al and Cu, or the step of removing the polyimide layer by a wet etch technique.

BRIEF DESCRIPTION OF THE DRAWINGS

These and other objects, features and advantages of the present invention will become apparent from the following detailed description and the appended drawings in which.

Figure 1A:
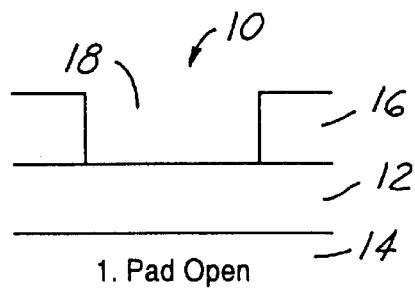
FIG. 1A is an enlarged, cross-sectional view of a pressed processed semiconductor structure for forming Au bumps by a conventional method.
Figure 1B:
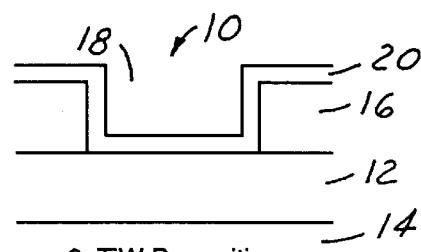
FIG. 1B is an enlarged, cross-sectional view of the semiconductor structure of FIG. 1A with a barrier layer of TiW conformably deposited on top.
Figure 1C:
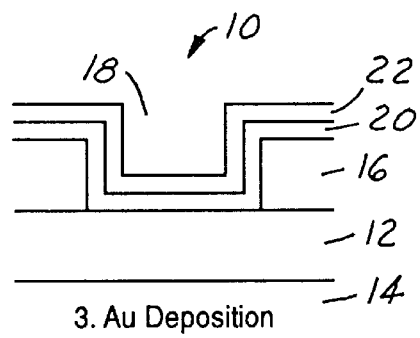
FIG. 1C is an enlarged, cross-sectional view of the conventional semiconductor structure of FIG. 1B with a gold seed layer deposited on top.
Figure 1D:
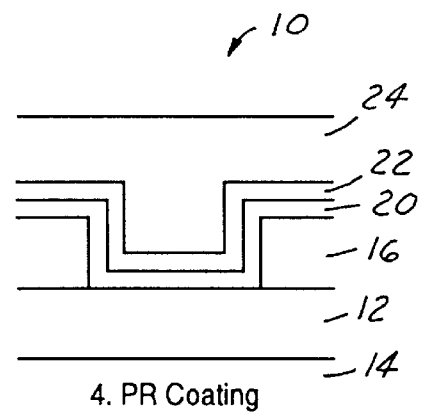
FIG. 1D is an enlarged, cross-sectional view of the conventional semiconductor structure of FIG. 1C with a thick photoresist layer deposited on top.
Figure 1E:
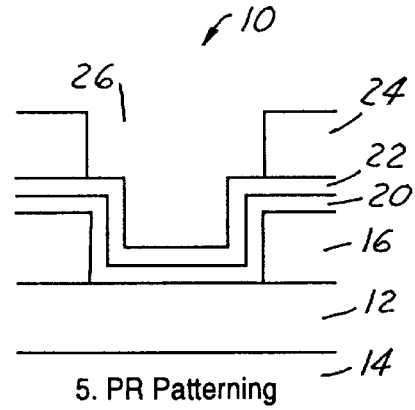
FIG. 1E is an enlarged, cross-sectional view of the conventional semiconductor structure of FIG. 1D with the photoresist layer patterned.

FIG. IF is an enlarged, cross-sectional view of the conventional semiconductor structure of FIG. 1E with gold electroplated in the opening for the bump.

Figure 1F:
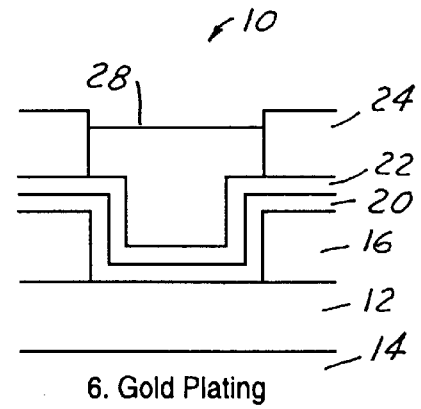
Figure 1G:
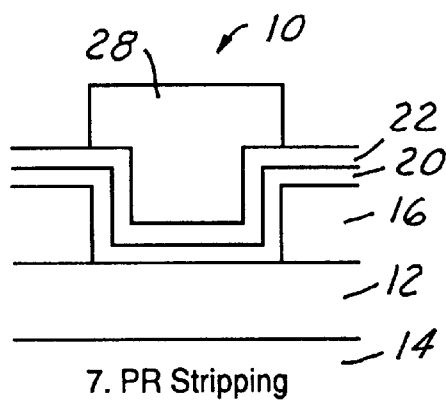

FIG. 1G is an enlarged, cross-sectional view of the conventional semiconductor structure of FIG. 1F with the photoresist layer removed.

Figure 1H:
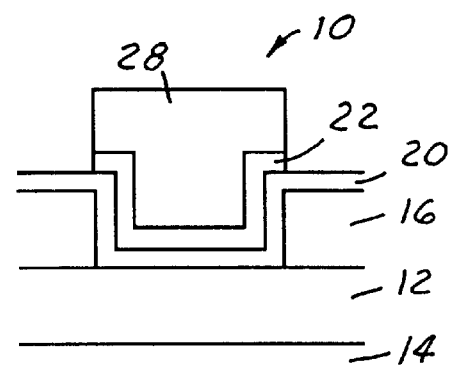

FIG. 1H is an enlarged, cross-sectional view of the conventional semiconductor structure of FIG. 1G with the Au seed layer removed.

Figure 1I:
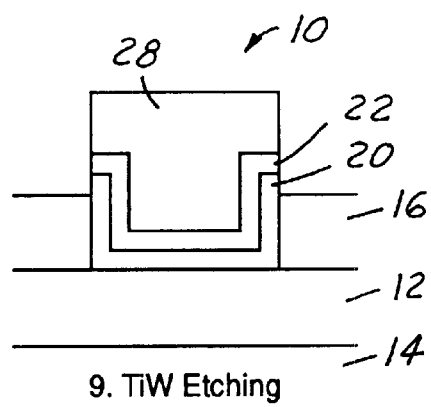

FIG. 1I is an enlarged, cross-sectional view of the conventional semiconductor structure of FIG. 1H with the TiW barrier layer removed.

Figure 2A:
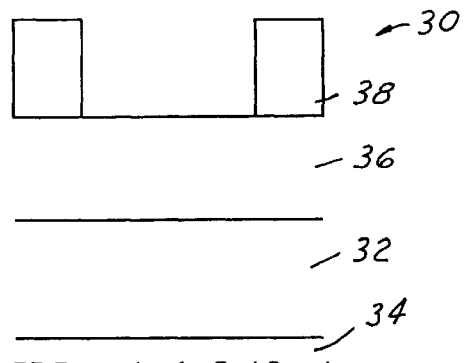

FIG. 2A is an enlarged, cross-sectional view illustrating a conventional aluminum bump forming process with a photomask deposited and patterned on a passivation layer.

Figure 2B:
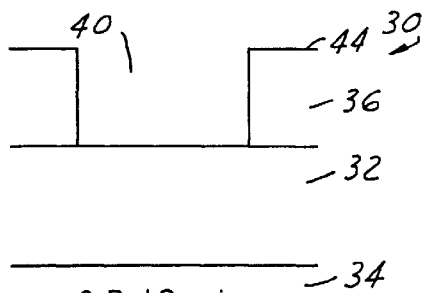

FIG. 2B is an enlarged, cross-sectional view of the conventional semiconductor structure of FIG. 2A with an opening formed by a dry etch process.

Figure 2C:
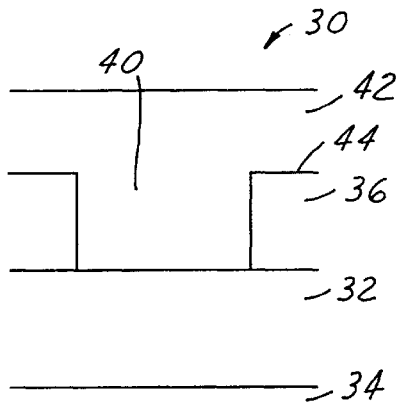

FIG. 2C is an enlarged, cross-sectional view of the conventional semiconductor structure of FIG. 2B with aluminum sputter deposited filling the opening.

Figure 2D:
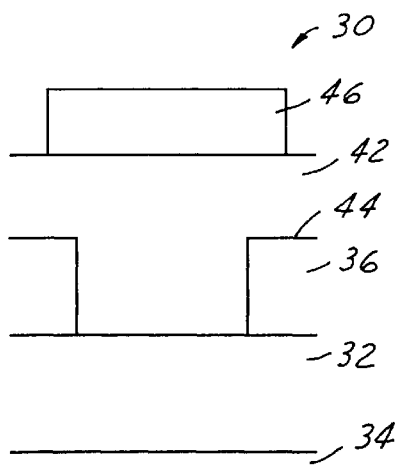

FIG. 2D is an enlarged, cross-sectional view of the conventional semiconductor structure of FIG. 2C with a second photomask deposited and patterned on top of the opening.

Figure 2E:
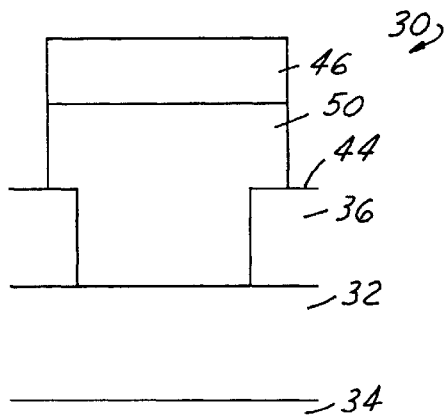

FIG. 2E is an enlarged, cross-sectional view of the conventional semiconductor structure of FIG. 2D with the aluminum bump patterned under the photomask layer.

Figure 2F:
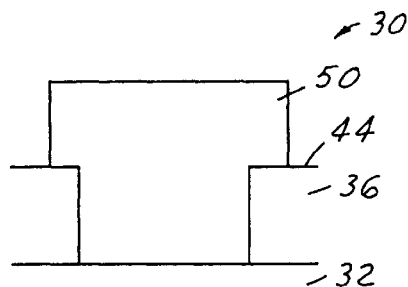

FIG. 2F is an enlarged, cross-sectional view of the conventional semiconductor structure of FIG. 2E with the second photomask removed to expose the aluminum bump formed.

Figure 3A:
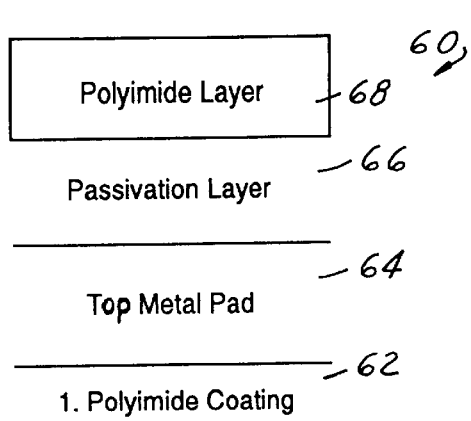

FIG. 3A is an enlarged, cross-sectional view of the present convention semiconductor structure with a passivation layer and a polyimide photoresist layer formed on top of an I/O pad.

Figure 3B:
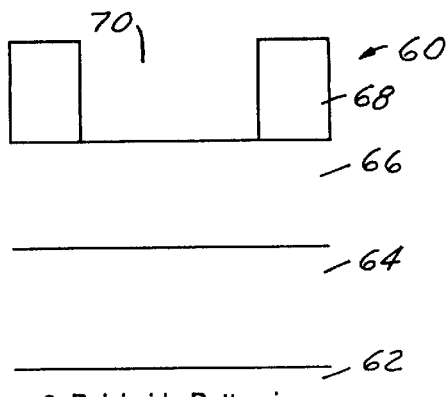

FIG. 3B is an enlarged, cross-sectional view of the present invention semiconductor structure of FIG. 3A with the polyimide photoresist layer patterned.

Figure 3C:
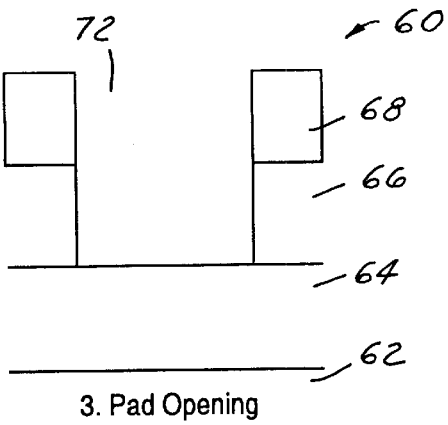

FIG. 3C is an enlarged, cross-sectional view of the conventional present invention semiconductor structure of FIG. 3B with an opening formed in the passivation layer for the bump.

Figure 3D:
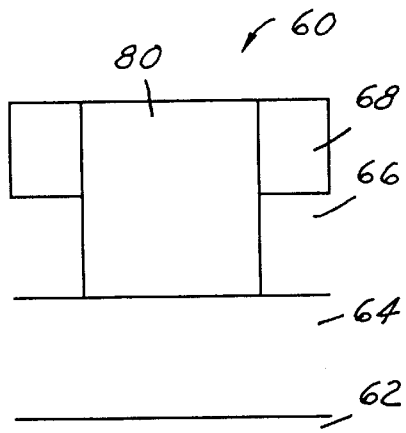

FIG. 3D is an enlarged, cross-sectional view of the present invention semiconductor structure of FIG. 3C with aluminum selectively deposited by CVD.

Figure 3E:
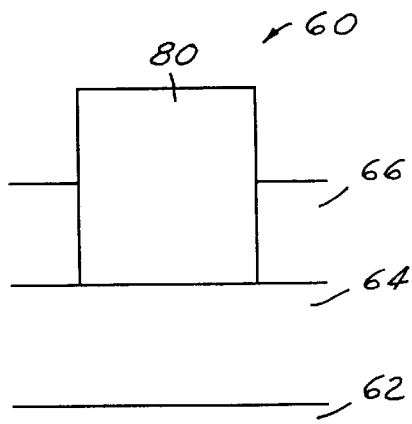

FIG. 3E is an enlarged, cross-sectional view of the present invention semiconductor structure of FIG. 3D with the passivation layer removed to expose the bump.

DETAILED DESCRIPTION OF THE PREFERRED EMBODIMENT

The present invention discloses a method for forming aluminum bumps that has significantly reduced processing steps than that required in a conventional aluminum bump forming process. The invention utilizes a chemical vapor deposition technique and a wet etch technique to complete the formation of the bump.

The method can be carried out by first depositing a passivation layer of an insulating material such as $SiO_2$, $Si_3N_4$, SiON, SOG or polyimide on top of a semiconductor structure overlying a plurality of I/O pads. A polyimide layer that is photosensitive is then deposited on top of the passivation layer to a thickness of at least 5 $\mu$m. The combined thickness of the polyimide layer and the passivation layer is important since it defines the height of the aluminum to be formed. The polyimide layer is then imaged by a photomask and a plurality of openings in the passivation layer is formed. A metal that includes aluminum is then selectively deposited into the openings by a chemical vapor deposition technique, followed by a step of at least partially removing the polyimide layer to form a plurality of aluminum bumps.

The present invention novel method may further be carried out, instead of using a photolithographic step, by printing a polyimide layer on top of the passivation layer to expose the portions of the passivation layer that overlies the plurality of I/O pads. Other processing steps that are similar to that described above can then be used to form the plurality of aluminum bumps.

When compared to a conventional gold or solder bumping process which requires more than ten separate processing steps, the present invention bump forming process is significantly simplified. Furthermore, the conventional method which requires a large number of steps that cannot be integrated into a standard CMOS process and thus, further increases the complexity and cost of forming gold or solder bumps. Even though there has been study on aluminum bumping which can be integrated into a CMOS method, such process requires a thick aluminum etching that is complicated and furthermore, the profile control and the metal residue problem presents severe drawbacks to such process.

The present invention novel method utilizes a polyimide layer as a patterned layer and then carries out a selective aluminum deposition process to fill openings for forming the bumps. The polyimide layer is utilized to achieve two purposes, i.e. first, to replace a photoresist layer as a patterning layer for pad opening, and secondly, to form the via hole for conducting the selective deposition and achieving good profile control with minimal residue problems. Moreover, no aluminum etching is required in the present invention novel method.

The present invention method can be easily integrated into a standard CMOS fabrication process including the passivation layer deposition step, a polyimide coating and patterning is then carried out followed by a passivation layer etching process and aluminum selective deposition process. The polyimide layer is then removed to expose the aluminum bumps and to facilitate the bonding of the bumps in subsequent packaging steps.

The present invention novel method is illustrated in FIGS. 3A~3E. A semiconductor structure 60 is formed by first forming a top metal pad, i.e. an input/output pad 64 on top of a preprocessed semiconductor substrate 62. On top of the I/O pad 64, is then deposited a passivation layer 66 of an insulating material such as $SiO_2$, $Si_3N_4$, SOG or SiON. On top of the passivation layer 66, is then deposited a polyimide layer 68 that is preferably photosensitive to a thickness of at least 5 $\mu$m, or to a thickness in the range between about 5 $\mu$m and about 10 $\mu$m. The thickness of the passivation layer 66 may be at least 1 $\mu$m, or in a range between about 1 $\mu$m and about 3 $\mu$m. The total thickness of the passivation layer 66 and the polyimide layer 68 is important since it determines the height of an aluminum bump to be formed in the opening.

In the next step of the process, as shown in FIG. 3B, the photosensitive polyimide layer 68 is patterned for an opening 70 for the aluminum bump to be formed. It should be noted that the plurality of I/O pads 62 should be formed in a metal that includes aluminum, or an aluminum alloy that includes up to 3 wt. % copper. The passivation layer 66 may be formed, instead of a homogeneous layer of a single material, by at least two sub-layers of different insulating materials. For instance, it may be formed by at least two sub-layers of $Si_3N_4$ and $SiO_2$. A suitable thickness for the first layer of $Si_3N_4$ may be between about 5000 Å and about 8000 Å, while a suitable thickness for the second layer of $SiO_2$ may be between about 2000 Å and about 4000 Å. A total thickness of the passivation layer is therefore at least 1 $\mu$m.

In the next step of the process, as shown in FIG. 3C, the dry etch method such as plasma etch is used to form the opening 72 in the passivation material layer 66 and the etching process stops at the metal I/O pad layer 64. A selective deposition process for aluminum, or aluminum that contains small amounts of other metals such as copper, is then carried out in a chemical vapor deposition process to fill the opening 72 and to form an aluminum bump 80. This is shown in FIG. 3D. It should be noted that the polyimide layer 68 stays during the CVD process and thus is utilized as a mold, together with the layer of the passivation material 66 to produce an aluminum bump 80 of sufficient height. The selective deposition process for aluminum is possible since aluminum only deposits on the aluminum surface of the I/O pad 64. The present invention novel polyimide layer 68 therefore performs two important functions, i.e. first, as a photoresist layer for forming the opening in the passivation layer 64, and then as a support for the VIA hole 72 during the selective deposition of aluminum forming the bump.

The final step of the present invention novel method, as shown in FIG. 3D, is carried out by a wet etch process for removing the polyimide layer 68 thus completing the bump forming process by exposing the aluminum bump 80. The exposed aluminum bump 80 can be used subsequently in bonding to other structures in a packaging step for the semiconductor device 60. For instance, the aluminum bump 80 may be used for bonding to conductive pads on a glass substrate of a liquid crystal display device.

The present invention novel method for forming aluminum bumps by chemical vapor deposition and wet etch has therefore been amply described in the above description and in the appended drawings of FIGS. 3A–3E.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming aluminum bumps by chemical vapor deposition and wet etch comprising the steps of:
    providing a pre-processed electronic substrate with a plurality of input/output (I/O) pads formed on top;
    depositing a passivation layer of an insulating material on top of said substrate;
    depositing a polyimide layer having a thickness of at least 5 µm on top of said passivation layer;
    imaging said polyimide layer and forming a plurality of openings in said passivation layer and said polyimide layer;
    depositing a metal comprising Al by CVD into said plurality of openings; and
    removing said polyimide layer and forming a plurality of bumps comprising Al.

2. A method for forming Al bumps by chemical vapor deposition and wet etch according to claim 1 further comprising the step of forming said plurality of I/O pads in a metal comprising Al.

3. A method for forming Al bumps by chemical vapor deposition and wet etch according to claim 1 further comprising the step of depositing said passivation layer from a material selected from the group consisting of silicon oxide, silicon nitride and spin-on-glass.

4. A method for forming Al bumps by chemical vapor deposition and wet etch according to claim 1 further comprising the step of depositing said passivation layer in at least two sub-layers of $Si_3N_4$ and $SiO_2$.

5. A method for forming Al bumps by chemical vapor deposition and wet etch according to claim 1 further comprising the step of depositing said passivation layer in at least two sub-layers of a first layer of $Si_3N_4$ in a thickness between about 5000 Å and about 8000 Å and a second layer of $SiO_2$ in a thickness between about 2000 Å and about 4000 Å.

6. A method for forming Al bumps by chemical vapor deposition and wet etch according to claim 1 further comprising the step of depositing said passivation layer to a thickness of at least 1 µm.

7. A method for forming Al bumps by chemical vapor deposition and wet etch according to claim 1 further comprising the step of depositing said polyimide layer to a thickness of at least 5 µm.

8. A method for forming Al bumps by chemical vapor deposition and wet etch according to claim 1 further comprising the step of depositing said polyimide layer to a thickness between about 5 µm and about 10 µm.

9. A method for forming Al bumps by chemical vapor deposition and wet etch according to claim 1 further comprising the step of forming said plurality of openings by plasma etch.

10. A method for forming Al bumps by chemical vapor deposition and wet etch according to claim 1 further comprising the step of depositing a metal comprising Al and Cu by CVD into said plurality of openings.

11. A method for forming Al bumps by chemical vapor deposition and wet etch according to claim 1 further comprising the step of removing said polyimide layer by wet etch.

12. A method for forming Al bumps by chemical vapor deposition and wet etch according to claim 1 further comprising the step of removing said polyimide layer by an etchant comprising HF and $NH_4F$.

13. A method for forming aluminum bumps by chemical vapor deposition and wet etch comprising the steps of:
    providing a pre-processed semiconductor structure with a plurality of I/O pads formed on top;
    depositing a passivation layer of an insulating material on top of said structure;
    printing a polyimide layer on top of said passivation layer exposing the portions of passivation layer that overlies said plurality of I/O pads;
    plasma etching through said passivation layer by using said polyimide layer as a mask forming a plurality of openings exposing said plurality of I/O pads;
    filling said plurality of openings with a metal comprising Al by a CVD technique; and
    removing said polyimide layer and exposing a plurality of bumps comprising Al.

14. A method for forming Al bumps by chemical vapor deposition and wet etch according to claim 13 further comprising the step of forming said plurality of I/O pads with a metal comprising Al.

15. A method for forming Al bumps by chemical vapor deposition and wet etch according to claim 13 further comprising the step of depositing said passivation layer from a material selected from the group consisting of silicon oxide, silicon nitride and spin-on-glass.

16. A method for forming Al bumps by chemical vapor deposition and wet etch according to claim 13 further comprising the step of depositing said passivation layer in at least two sub-layers of $Si_3N_4$ and $SiO_2$.

17. A method for forming Al bumps by chemical vapor deposition and wet etch according to claim 13 further comprising the step of depositing said passivation layer in at least two sub-layers of a first layer of $Si_3N_4$ in a thickness between about 5000 Å and about 8000 Å and a second layer of $SiO_2$ in a thickness between about 2000 Å and about 4000 Å.

18. A method for forming Al bumps by chemical vapor deposition and wet etch according to claim 13 further comprising the step of printing said polyimide layer by screen printing or stencil printing.

19. A method for forming Al bumps by chemical vapor deposition and wet etch according to claim 13 further comprising the step of filling said plurality of openings with a metal comprising Al and Cu.

20. A method for forming Al bumps by chemical vapor deposition and wet etch according to claim 13 further comprising the step of removing said polyimide layer by a wet etch technique.

* * * * *